US010840178B2

(12) United States Patent
Sato et al.

(10) Patent No.: US 10,840,178 B2
(45) Date of Patent: Nov. 17, 2020

(54) CIRCUIT ASSEMBLY AND MOUNTING UNIT

(71) Applicant: Molex, LLC, Lisle, IL (US)

(72) Inventors: Shuichi Sato, Yamato (JP); Tetsunori Tsumuraya, Yamato (JP)

(73) Assignee: Molex, LLC, Lisle, IL (US)

( * ) Notice: Subject to any disclaimer, the term of this patent is extended or adjusted under 35 U.S.C. 154(b) by 84 days.

(21) Appl. No.: 16/174,445

(22) Filed: Oct. 30, 2018

(65) Prior Publication Data

US 2019/0139882 A1 May 9, 2019

Related U.S. Application Data

(60) Provisional application No. 62/581,828, filed on Nov. 6, 2017.

(30) Foreign Application Priority Data

Jun. 21, 2018 (JP) ................................ 2018-117902

(51) Int. Cl.

| | |
|---|---|
| ***H01L 23/495*** | (2006.01) |
| ***H01L 23/498*** | (2006.01) |
| ***H05K 7/20*** | (2006.01) |
| ***H05K 7/14*** | (2006.01) |
| ***H02M 7/00*** | (2006.01) |
| ***H01L 23/367*** | (2006.01) |
| *H02M 1/32* | (2007.01) |

(52) U.S. Cl.

CPC ...... *H01L 23/49861* (2013.01); *H01L 23/367* (2013.01); *H02M 7/003* (2013.01); *H05K 7/1432* (2013.01); *H05K 7/209* (2013.01); *H02M 2001/327* (2013.01)

(58) Field of Classification Search

CPC .... H01L 23/49661; H01L 23/367; B60L 1/00; B60K 1/00

See application file for complete search history.

(56) References Cited

U.S. PATENT DOCUMENTS

| | | | | |
|---|---|---|---|---|
| 6,354,847 | B1 * | 3/2002 | Nakanishi | H01R 13/2442 439/76.2 |
| 2010/0127565 | A1 * | 5/2010 | Fukazu | B60K 1/00 307/9.1 |
| 2011/0186327 | A1 | 8/2011 | Yoshida | |
| 2011/0261600 | A1 | 10/2011 | Tachibana | |
| 2015/0245503 | A1 | 8/2015 | Hansen | |
| 2016/0322286 | A1 | 11/2016 | Fujino et al. | |
| 2017/0318659 | A1 * | 11/2017 | Chin | H05K 7/20472 |

FOREIGN PATENT DOCUMENTS

| | | | |
|---|---|---|---|
| CN | 106463928 | A | 2/2017 |
| JP | 09-321395 | A | 12/1997 |
| JP | 3855306 | B2 | 12/2006 |

OTHER PUBLICATIONS

Extended European Search Report received for European Application No. 18200772.4, dated Mar. 6, 2019, 10 pages.

* cited by examiner

*Primary Examiner* — Phuc T Dang
(74) *Attorney, Agent, or Firm* — Molex, LLC

(57) ABSTRACT

Each of busbars includes a bottom surface and a top surface. A holding member is made of resin and is formed integrally with the busbars. The bottom surface of each of the busbars includes exposed regions which are exposed downwards from the holding member.

10 Claims, 11 Drawing Sheets

CIRCUIT ASSEMBLY AND MOUNTING UNIT

RELATED APPLICATIONS

This application claims priority to U.S. Application No. 62/581,828, filed Nov. 6, 2017 and to Japanese Application No. 2018-117902, filed Jun. 21, 2018, both of which are incorporated herein by reference in their entirety.

TECHNICAL FIELD

The disclosure provides a circuit assembly and a mounting unit including the circuit assembly and an electronic component mounted in the circuit assembly.

BACKGROUND ART

A circuit such as an inverter circuit and a converter circuit is commonly used as a circuit assembly for regulating a large current. Such a circuit assembly includes a heat-generating electronic component such as a power semiconductor. Hence, circuit assemblies of this type may have issues associated with the heat dissipation and the cooling performance of the electronic component. In a conventional circuit assembly, for instance, an insulating film is formed on a metal plate made from a material with a high thermal conductivity (e.g., aluminum). On the insulating film, a circuit pattern of copper foil or the like material is formed and then an electronic component is mounted on the circuit pattern. In addition, in another example of conventional circuit assemblies, such as one described in Patent Document 1, an electronic component is mounted directly on the upper side of a busbar where a large current flows. In the circuit assembly of this type, an insulating material (resin) configured to hold the busbar is provided under the busbar, and a radiator is fixed to the opposite side of this insulating material to the busbar.

Patent Document 1: Japanese Patent Publication No. H9(1997)-321395 A

SUMMARY

There is room for improvement on the heat dissipation/cooling performance of the electronic component of both of the above-described conventional circuit assemblies. For instance, the structure where the electronic component is disposed on the circuit pattern formed of copper foil has a problematic difficulty in effectively transferring heat via the thin copper foil. On the other hand, the structure where the resin for holding the busbar is formed between the busbar and the radiator, the resin may obstruct the transferring of heat.

Hence, the circuit assembly and the component mounting unit proposed by the disclosure provide improvement in the heat dissipation/cooling performance for the electronic component.

An exemplar circuit assembly proposed by the disclosure includes a holding member formed of resin, as well as a busbar formed integrally with the holding member and having a first surface facing a first direction and a second surface facing an opposite direction to the first direction. The first surface has an exposed region that is exposed from the holding member in the first direction.

An exemplar mounting unit proposed by the disclosure includes the circuit assembly and an electronic component mounted on the second surface of the busbar.

DETAILED DESCRIPTION OF THE PREFERRED EMBODIMENTS

Figure 3:
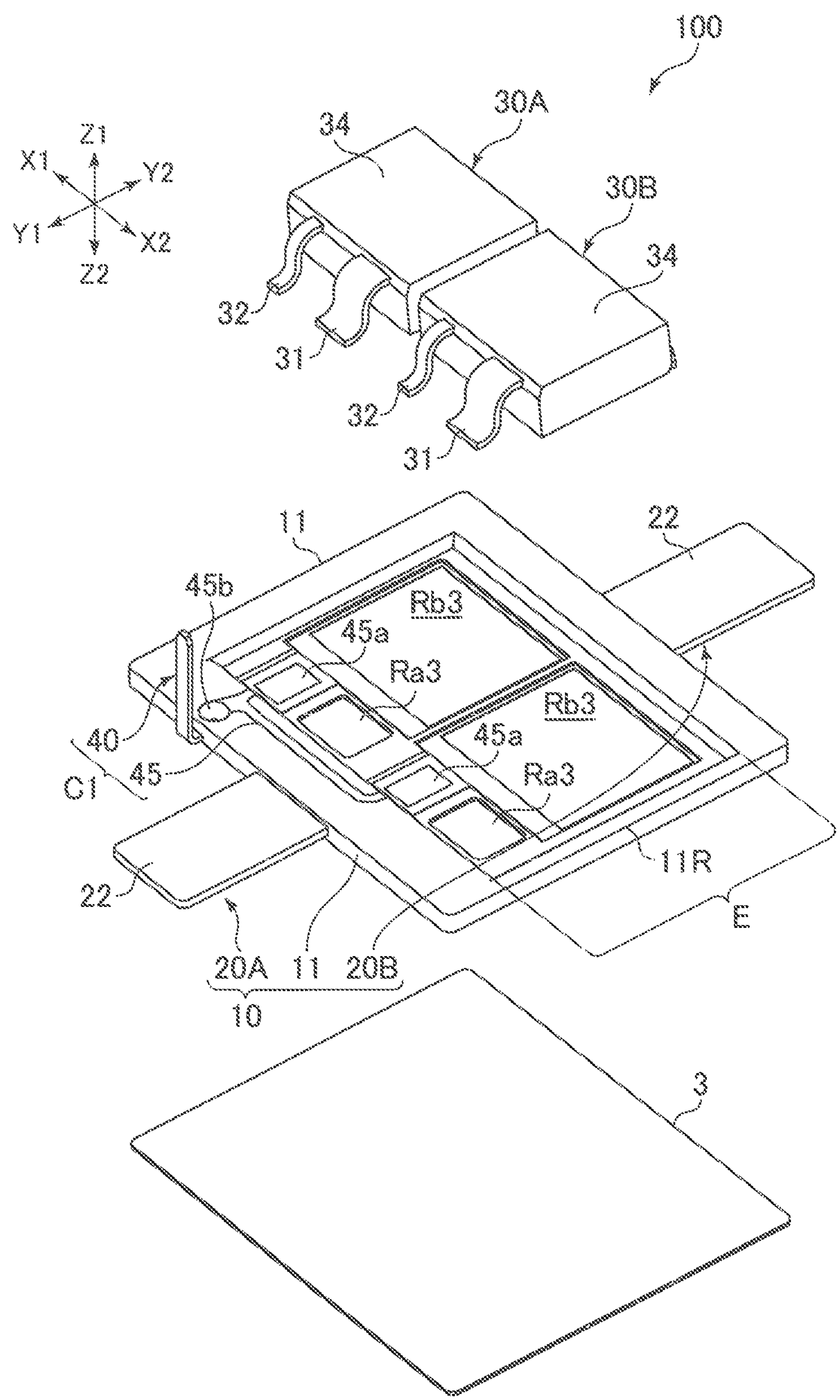
FIG. 3 is an exploded perspective view of the top surface of the mounting unit viewed from an upper left position with the electronic component and the heat-dissipation sheet of FIG. 1 separated from each other.

Hereinbelow description is provided for a circuit assembly 10 and a mounting unit 100 representing, respectively, an exemplar circuit assembly and an exemplar mounting unit proposed by the disclosure. As illustrated in FIG. 3, the circuit assembly 10 includes busbars 20A and 20B serving as power circuits. The mounting unit 100 includes the circuit assembly 10, electronic components 30A and 30B that are mounted in the circuit assembly 10, and a heat-dissipation sheet 3. It should be noted that the mounting unit 100 is connected with external parts/devices, such as electrical connection boxes, other power circuits, signal circuits, cables, etc. The mounting unit 100, however, is not limited to ones connected to an external part/device.

Hereinafter, the Y1 and the Y2 directions illustrated in FIG. 1, etc. are referred to as the forward and the rearward directions, respectively; the illustrated Z1 and the Z2 directions are referred to as the upward and the downward directions, respectively; and the illustrated X1 and the X2 directions are referred to as the rightward and the leftward directions, respectively. The directional nomenclature is used for describing the configuration and the operation of various portions of the circuit assembly 10 and the mounting unit 100. The directions are not absolute but indicate only the relations of relative positions among such portions. Hence, these directions correspond to their respective ones in the drawings when the circuit assembly 10 and the mounting unit 100 are placed as they are illustrated in the drawings. If, however, the circuit assembly 10 and the mounting unit 100 are placed in different states, the directions should be interpreted accordingly.

As illustrated in FIGS. 1-8, the circuit assembly 10 includes a plurality of busbars 20A and 20B serving as power circuits. The circuit assembly 10 also includes a holding member 11 serving an insulator for holding the plurality of busbars 20A and 20B. The mounting unit 100 includes the circuit assembly 10, the electronic components 30A and 30B disposed in electrical connection with the plurality of busbars 20A and 20B of the circuit assembly 10, and the heat-dissipation sheet 3 pasted on the circuit assembly 10 and configured to radiate the heat from the electronic components 30A and 30B. It should be noted that the electronic components 30A and 30B are heat-generating elements called power semiconductors, and include such elements as light emitting diodes (LEDs), transistors (e.g., field effect transistors=FETs, MOS-FETs, etc.), resistors, etc. They may be, however, any electronic components as long as they generate heat with the power supplied from other devices.

Figure 4:
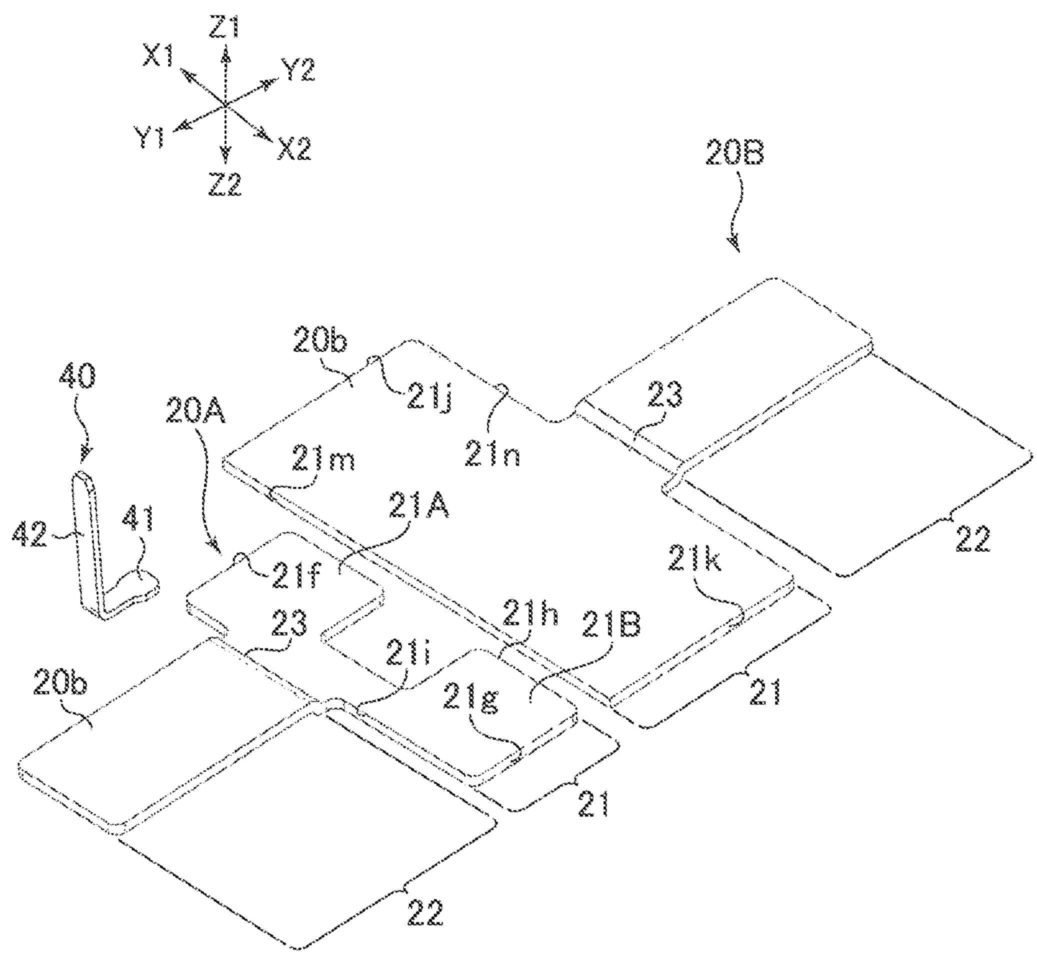
FIG. 4 is a perspective view of top surfaces of a busbar and a signal terminal of a circuit assembly viewed from an upper left position.
Figure 5:
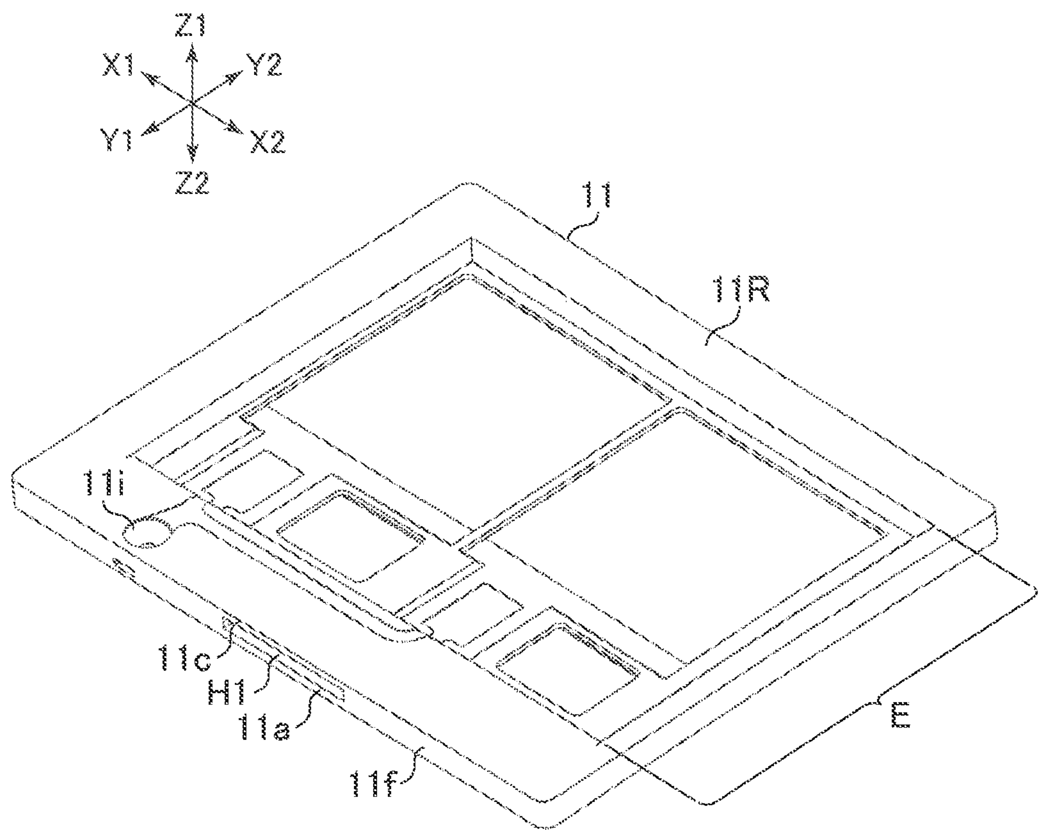
FIG. 5 is a perspective view of a top surface of a holding member of the circuit assembly viewed from an upper left position.

As illustrated in FIG. 3 to FIG. 5, the circuit assembly 10 includes a flat-plate-shaped holding member 11 and two busbars 20A and 20B. The holding member 11 as well as the busbars 20A and 20B are formed integrally with each other by any of such methods as so-called the injection molding, the insert molding, monolithic molding, and the like. Specifically, in a state where the busbars 20A and 20B are disposed in a cavity formed by molds, the cavity is filled up with a soft resin material that will be the holding member 11. Once the resin becomes hardened, the busbars 20A and 20B are held by the resin (holding member 11). Hence, some portions of the busbars 20A and 20B are buried in and thus fixed to the holding member 11. The method of forming the holding member 11 together with the busbars 20A and 20B is not limited to the one described above.

Each of the busbars 20A and 20B is a member formed of a metal plate (e.g., aluminum plate or copper plate) by a punching process. The two busbars 20A and 20B are insulated from each other and some portions thereof are exposed. In that state, the two busbars 20A and 20B are held by the holding member 11 integrally formed of resin (i.e., insulating material). An example of the circuit assembly 10 has two busbars 20A and 20B separated away from each other in the horizontal direction (specifically in the front-rear direction) (see FIG. 4). Hence, a portion of the holding member 11 enters the gap between the two busbars 20A and 20B, and thus insulates the two busbars 20A and 20B from each other. The positional relation between the two busbars 20A and 20B is not limited to the one of the circuit assembly 10. In addition, the number of busbars held by a single holding member 11 may be greater than two. It should be noted that liquid crystal polymer, acrylonitrile-butadiene-styrene (ABS) resin, nylon resin, etc. are desired insulating material to be used for the holding member 11, but that any insulating material may be used as long as it is neither melted nor softened by the heat generated from the electronic component.

Figure 2:
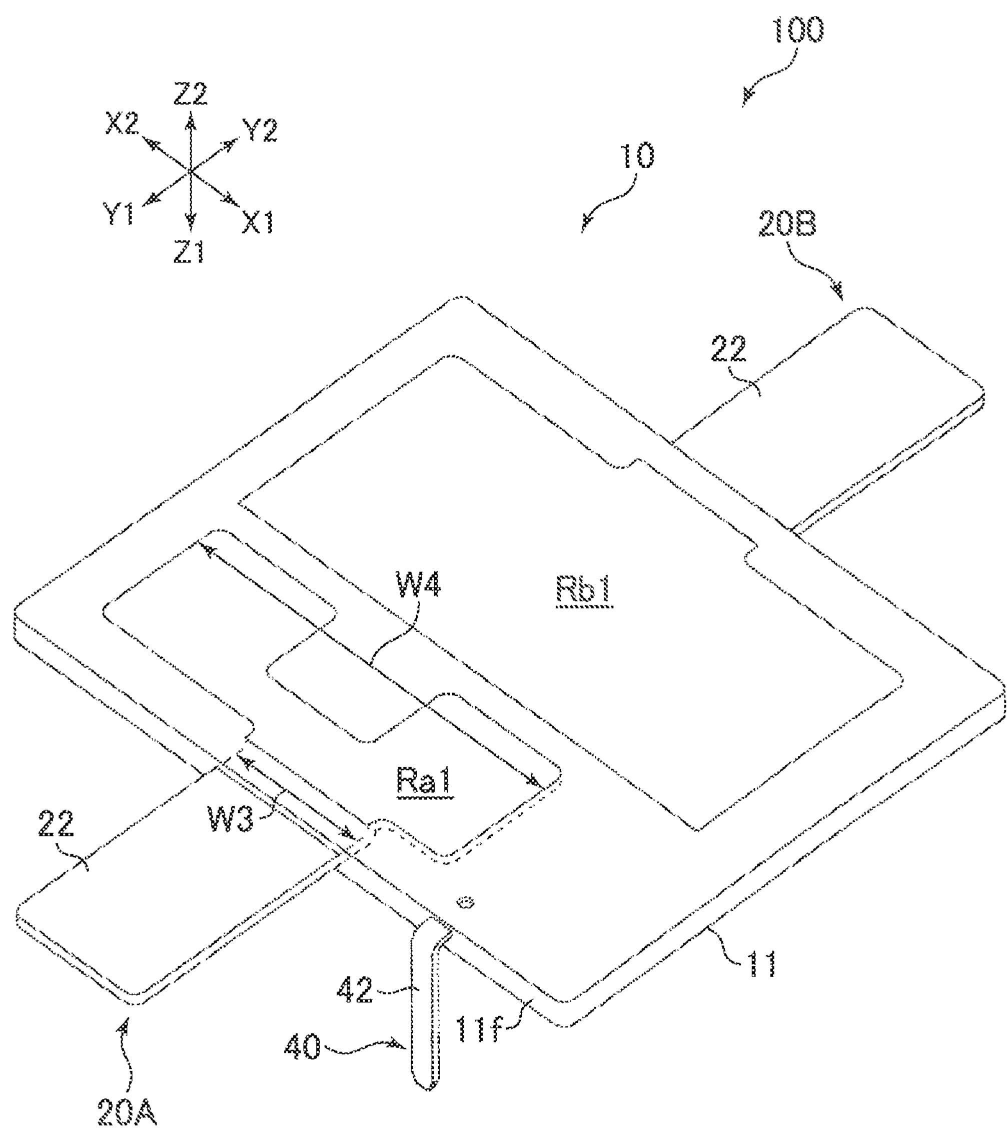
FIG. 2 is a perspective view of a bottom surface of the mounting unit viewed from an upper right position with a heat-dissipation sheet removed.
Figure 8:
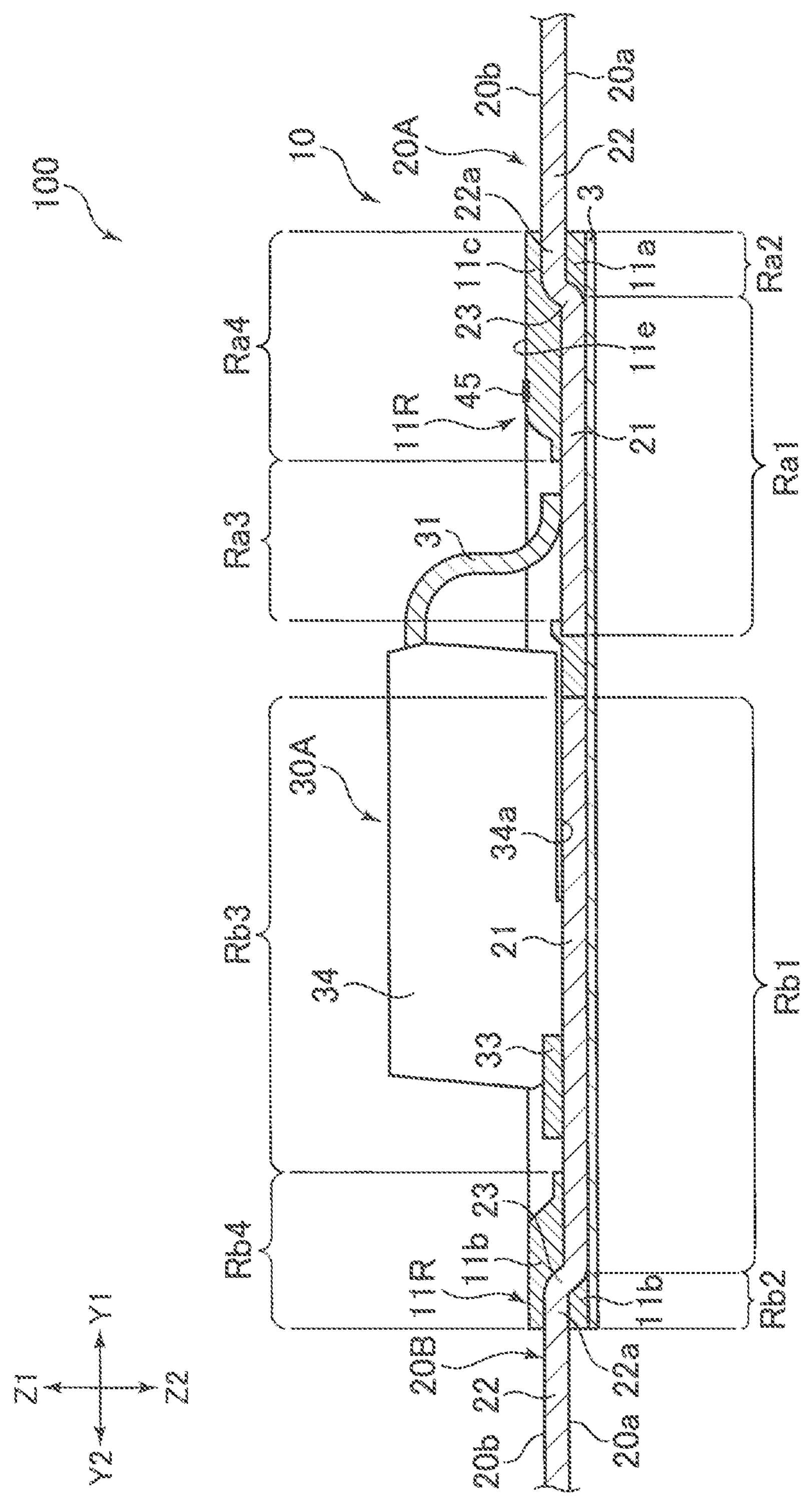
FIG. 8 is a cross-sectional view of a portion taken along line VIII-VIII of FIG. 6.

Each of the busbars 20A and 20B has two surfaces that face directions opposite to each other in the up-down direction: a bottom surface 20*a*, which is a first surface; and a top surface 20*b*, which is a second surface. The electronic components 30A and 30B are mounted on the top surface 20*b*. As illustrated in FIG. 2 and FIG. 8, the bottom surface 20*a* of each of the busbars 20A and 20B has regions Ra1 and Rb1 exposed downwards from the holding member 11. Hereinafter the regions Ra1 and Rb1 will be referred to as the "exposed regions." When the electronic components 30A and 30B are mounted on the circuit assembly 10, the exposed regions Ra1 and Rb1 function as "heat-dissipation portions" configured to radiate heat from the electronic components 30A and 30B. In the busbars 20A and 20B, the bottom surfaces 20*a* have regions Ra2 and Rb2, respectively. The regions Ra2 and Rb2 are covered by the holding member 11 and serve as first covered regions. Hereinafter the regions Ra2 and Rb2 will be referred to as the "bottom covered regions." The holding member 11 includes bottom covering portions 11*a* and 11*b* located underneath the bottom covered regions Ra2 and Rb2 and covering the bottom covered regions Ra2 and Rb2. Hence, the bottom covering portions 11*a* and 11*b* serve as first covering portions.

As described above, the busbars 20A and 20B include the exposed regions Ra1 and Rb1, respectively, where the bottom surfaces 20*a* of the busbars 20A and 20B are exposed from the holding members 11. Hence, the busbars 20A and 20B may improve their performance of dissipating heat from the electronic components 30A and 30B. In the illustrated example of the mounting unit 100, the heat-dissipation sheet 3 is disposed under the circuit assembly 10. In the exposed regions Ra1 and Rb1, however, the busbars 20A and 20B are in direct contact with the heat-dissipation sheet 3 without the insulating-material resin of the holding member 11 that would otherwise be interposed between the heat-dissipation sheet 3 and each of the busbars 20A and 20B. Hence, the heat is smoothly transferred from the electronic components 30A and 30B to the heat-dissipation sheet 3, and thus the heat dissipation performance of the electronic components 30A and 30B may be improved. In addition, even if the busbars 20A and 20B are small-sized, sufficient heat dissipation performance is obtained. Hence, the mounting unit 100 may be provided in a smaller size. It should be noted that the mounting unit 100 may include a radiator (heat sink or heat pipe) disposed under the heat-dissipation sheet 3 and in contact with the heat-dissipation sheet 3. In this case, the heat is transferred smoothly from the busbars 20A and 20B to the radiator.

The sizes of the exposed regions Ra1 and Rb1 are larger than the sizes of the bottom covered regions Ra2 and Rb2, respectively. Hence, a sufficient contact area is secured between the heat-dissipation sheet 3 and each of the busbars 20A and 20B, which may provide an improved performance of dissipating heat from the electronic components 30A and 30B. As illustrated in FIG. 8, in the illustrated example of the circuit assembly 10, the width of the exposed region Ra1 measured in the front-rear direction is wider than the width of the bottom covered region Ra2 measured in the front-rear direction. In addition, the width W3 (see FIG. 2) of the exposed region Ra1 measured in the left-right direction is wider than the width W4 of the bottom covered region Ra2 measured in the left-right direction (see FIG. 2). Likewise, the width of the exposed region Rb1 measured in the front-rear direction is wider than the width of the bottom covered region Rb2 measured in the front-rear direction. In addition, the width of the exposed region Rb1 measured in the left-right direction is wider than the width of the bottom covered region Rb2 measured in the left-right direction. Hence, the areas of the exposed regions Ra1 and Rb1 are greater than the bottom covered regions Ra2 and Rb2, respectively.

As illustrated in FIG. 4, a level difference 23 is formed at an intermediate position along the length in the front-rear direction of each of the busbars 20A and 20B. Each of the busbars 20A and 20B includes a plate-shaped external connection portion 22 and a plate-shaped part-mounting portion 21, which are on the opposite sides of the level difference 23. The part-mounting portion 21 is at a lower level than the external connection portion 22. In the illustrated example of the circuit assembly 10, the width of the external connection portion 22 measured in the left-right direction is narrower than the width of the part-mounting portion 21 measured in the left-right direction. The external connection portion 22 of the busbar 20A extends forwards from the part-mounting portion 21, whereas the external connection portion 22 of the busbar 20B extends rearwards from the part-mounting portion 21. Hence, each of the busbars 20A and 20B has a substantially T-shaped form. The part-mounting portion 21 of the busbar 20A includes: a rectangular portion 21A configured to be connected with a power terminal 31 of the first one electronic component 30A (to be described later); and a rectangular portion 21B configured to be connected with a power terminal 31 of the second electronic component 30B (to be described later). In the example described here, the width of the part-mounting portion 21 of the busbar 20B measured in the front-rear direction is wider than the width of the part-mounting portion 21 of the busbar 20A measured in the front-rear direction. Main bodies 34 of the electronic components 30A and 30B are located on the upper side of the part-mounting portion 21 of the busbar 20B (see FIG. 7). A base portion 22*a* of the external connection portion 22 (a portion near the level difference 23; see FIG. 8) is held by the holding member 11. The external connection portion 22 of the busbar 20A sticks out forwards from the holding member 11, whereas the external connection portion 22 of the busbar 20B sticks out rearwards from the holding member 11. When the mounting unit 100 is used, external parts and devices, such as electrical connection boxes, other power circuits, signal circuits, cables, etc., are connected with the external connection portion 22. It should be noted that shapes of the busbars 20A and 20B are not limited to the examples of the illustrated circuit assembly 10.

As illustrated in FIG. 8, the above-described exposed regions Ra1 and Rb1 are formed in the part-mounting portion 21, whereas the bottom covered regions Ra2 and Rb2 are formed in the base portions 22*a* of the external connection portions 22. Hence, the exposed regions Ra1 and Rb1 are located at lower levels than the bottom covered regions Ra2 and Rb2, respectively. With this structure, the irregular bottom surface of the circuit assembly 10 may be smoother. Specifically, the bottom surfaces 20*a* in the exposed regions Ra1 and Rb1 may have reduced level differences with the bottom surfaces of the bottom covering portions 11*a* and 11*b* of the holding member 11, which may provide a lower-profile circuit assembly.

In the illustrated example of the circuit assembly 10, the bottom surfaces 20*a* in the exposed regions Ra1 and Rb1 are located at substantially the same level as the bottom surfaces of the bottom covering portions 11*a* and 11*b*. To put it differently, the bottom surfaces 20*a* in the exposed regions Ra1 and Rb1 and the bottom surfaces of the bottom covering portions 11*a* and 11*b* form a single plane. Hence, a gap may be less likely to be left between the heat-dissipation sheet 3 and the bottom surface 20*a* in each of the exposed regions Ra1 and Rb1. Unlike the illustrated example of the circuit assembly 10, the bottom surfaces 20*a* in the exposed regions Ra1 and Rb1 may be at lower levels than the bottom surfaces of the bottom covering portions 11*a* and 11*b*. Even in this case, a gap may be less likely to be left between the heat-dissipation sheet 3 and the bottom surface 20*a* in each of the exposed regions Ra1 and Rb1.

As illustrated in FIG. 3 and FIG. 8, the top surfaces 20*b* of the busbars 20A and 20B include regions Ra3 and Rb3 located in the part-mounting portions 21 and exposed upwards from the holding member 11 (hereinafter, the regions Ra3 and Rb3 will be referred to as the "part-connecting regions"). The electronic component 30A is in contact with the part-connecting regions Ra3 and Rb3, whereas the electronic component 30B is in contact with the part-connecting regions Ra3 and Rb3. To be more specific, two part-connecting regions Ra3 are defined in the top surface 20*b* of the busbar 20A. A terminal 31 of the electronic component 30A is attached to—specifically soldered to, for example—a first one of the part-connecting regions Ra3. In addition, a terminal 31 of the electronic component 30B is attached to—specifically soldered to, for example—a second one of the part-connecting regions Ra3. Two part-connecting regions Rb3 are defined in the top surface 20*b* of the busbar 20B. A terminal 33 of the electronic component 30A is attached to—specifically soldered to, for example—a first one of the part-connecting regions Rb3. In addition, a terminal 33 of the electronic component 30B is attached to—specifically soldered to, for example—a second one of the part-connecting regions Rb3. The terminals 31 and 33 are, for instance, power terminals where the electric power regulated by means of the mounting unit 100 flows. In the specification of the present disclosure, the part-connecting regions Ra3 and Rb3 refer to regions exposed upwards from the holding member 11. It is not necessary for the part-connecting regions Ra3 and Rb3 to have a part mounted therein. Any part-connecting region with no electronic component mounted therein may be used for heat dissipation.

As illustrated in FIG. 8, the top surfaces 20*b* of the busbars 20A and 20B have regions Ra4 and Rb4, respectively. The regions Ra4 and Rb4 are covered by the holding member 11, and serve as second covered regions (hereinafter, the regions Ra4 and Rb4 will be referred to as the "top covered regions"). The holding member 11 includes top covering portions 11*c* and 11*d* serving as second covering portions to cover the top covered regions Ra4 and Rb4, respectively.

As illustrated in FIG. 8, while the part-connecting region Ra3 of the busbar 20A is where the power terminal 31 is attached, the part-connecting region Ra3 and the exposed region Ra1 are located on opposite sides to each other of the busbar 20A. To put it differently, in the plan view (seen in the up-down direction) of the circuit assembly 10, the part-connecting region Ra3 overlaps the exposed region Ra1. With this structure, a shorter heat transferring path is provided from the electronic components 30A and 30B to the heat-dissipation sheet 3. Hence, the heat generated from the electronic components 30A and 30B mounted in the part-connecting region Ra3 may be efficiently transferred to the heat-dissipation sheet 3 via the exposed region Ra3. In the illustrated example of the circuit assembly 10, the entire portion of the part-connecting region Ra3 overlaps a portion of the exposed region Ra1 in the plan view.

The exposed region Rb1 of the busbar 20B and the part-connecting region Rb3 thereof have a similar positional relation with each other to the corresponding relation for the busbar 20A. To put it differently, as illustrated in FIG. 8, while the part-connecting region Rb3 is where the power terminal 33 is attached, the part-connecting region Rb3 is located on the opposite side to the side where the exposed region Rb1 is located. To be more specific, the entire portion of part-connecting region Rb3 overlaps a portion of the exposed region Rb1 in the plan view.

It should be noted that the positional relations that the part-connecting regions Ra3 and Rb3 individually have with their corresponding exposed regions Ra1 and Rb1 are not limited to the ones in the illustrated example of the circuit assembly 10. For instance, only a portion of each of the part-connecting regions Ra3 and Rb3 may overlap the corresponding one of the exposed regions Ra1 and Rb1 in the plan view.

Figure 6:
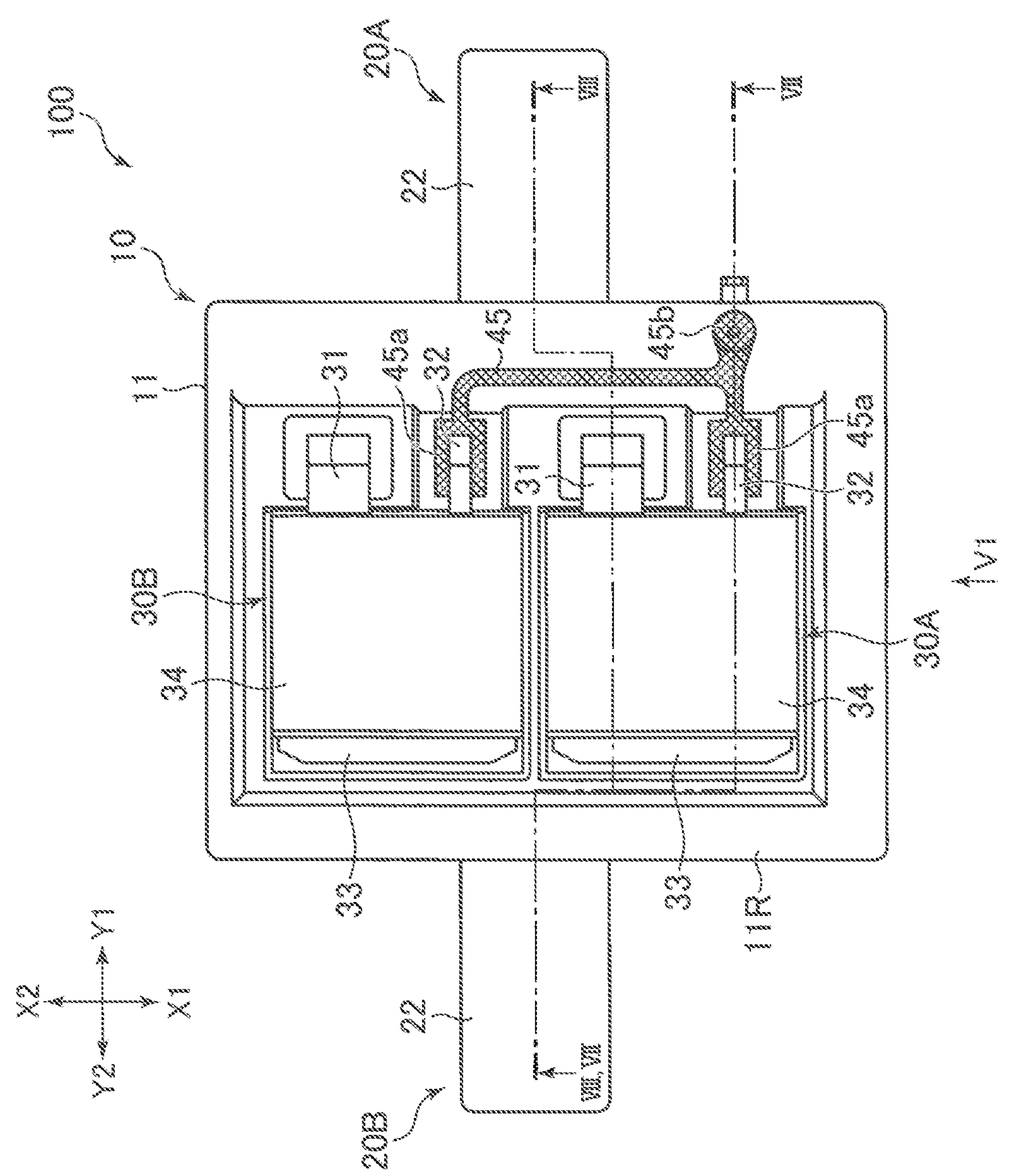
FIG. 6 is a plan view of the mounting unit.

As illustrated in FIG. 3 and FIG. 6, each of the electronic components 30A and 30B includes the power terminals 31 and 33 as well as the main body 34. Each of the electronic components 30A and 30B may further include a signal terminal 32. The main body 34 has a substantially rectangular parallelepiped shape, and includes, for instance, a semiconductor device, a mold resin to accommodate a semiconductor device, or the like. The power terminal 31 and the signal terminal 32 are located on the opposite side of the main body 34 to the side where power terminal 33 is located. In the illustrated example, the power terminal 31 and the signal terminal 32 extend from upper portions of the main body 34. The power terminal 33 is located in a bottom portion of the main body 34. To put it differently, the power terminal 33 is disposed to overlap the main body 34 in the plan view. The power terminal 33 is attached to the part-connecting region Rb3 (see FIG. 8). In addition, the width of the power terminal 33 measured in the left-right direction is wider than the width of the power terminal 31 measured in the left-right direction.

While the part-connecting region Rb3 is where the power terminals 33 of the electronic components 30A and 30B are attached, the part-connecting region Rb3 is formed to overlap at least a portion of the main bodies 34 of the electronic components 30A and 30B in the plan view. Some or entire portions of the bottom surfaces of the main bodies 34 may be in contact with or not in contact with the part-connecting region Rb3. The part-connecting region Rb3 has a larger size than the main body 34, and most portion of the main body 34 is located within the part-connecting region Rb3. As the part-connecting region Rb3, the power terminal 33, and the main body 34 have above-described positional relations, the heat generated from the power terminal 33 and/or the main body 34 may be more easily transferred to the part-connecting region Rb3 via the power terminal 33.

It should be noted that the size of the exposed region Rb1 of the busbar 20B is larger than the size of the part-connecting region Rb3 of the busbar 20B. Specifically, the width of the exposed region Rb1 measured in the front-rear direction is wider than the width of the part-connecting region Rb3 measured in the front-rear direction. Hence, the heat generated from the electronic components 30A and 30B may be radiated efficiently. Likewise, the size of the exposed region Ra1 of the busbar 20A is larger than the size of the part-connecting region Rb3 of the busbar 20A.

As described earlier, the holding member 11 includes: the bottom covering portions 11*a* and 11*b* configured to cover the bottom covered regions Ra2 and Rb2 of the busbars 20A and 20B, respectively; and the top covering portions 11*c* and 11*d* configured to cover the top covered regions Ra4 and Rb4 of the busbars 20A and 20B, respectively.

As illustrated in FIG. 8, the bottom covering portion 11*a* and the top covering portion 11*c* are located on opposite sides of the busbar 20A to each other in the up-down direction. In the illustrated example of the circuit assembly 10, the bottom covering portion 11*a* and the top covering portion 11*c* are located on the opposite sides of the base portion 22*a* of the external connection portion 22 of the busbar 20A to each other in the up-down direction. Hence, the top surface 20*b* of the busbar 20A, the bottom surface 20*a* of the busbar 20A, the top covering portion 11*c* of the holding member 11, and the bottom covering portion 11*a* of the holding member 11 are located, from the top side to the bottom side, in the order of the top covering portion 11*c*, the top surface 20*b*, the bottom surface 20*a*, and the bottom covering portion 11*a*. The bottom covering portion 11*a* and the top covering portion 11*c* are connected to each other. Specifically, the bottom covering portion 11*a* and the top covering portion 11*c* are connected to each other by means of a portion located on the right-hand side of the base portion 22*a* of the external connection portion 22 and by means of a portion located on the left-hand side of the base portion 22*a* of the external connection portion 22. The holding member 11 includes a peripheral portion 11R surrounding a region E (to be described later) (see FIG. 1). Both the portion located on the right-hand side of the base portion 22*a* of the external connection portion 22 and the portion located on the left-hand side of the base portion 22*a* of the external connection portion 22 are parts of the peripheral portion 11R, and are the portions, together with the covering portions 11*a* and 11*c*, surrounding the base portion 22*a* of the external connection portion 22.

In the illustrated example of the circuit assembly 10, the bottom covering portion 11*b* and the top covering portion 11*d* are located on the opposite sides of the base portion 22*a* of the external connection portion 22 of the busbar 20B to each other. Hence, the top surface 20*b* of the busbar 20A, the bottom surface 20*a* of the busbar 20A, the top covering portion 11*d* of the holding member 11, and the bottom covering portion 11*b* of the holding member 11 are located, from the top side to the bottom side, in the order of the top covering portion 11*d*, the top surface 20*b*, the bottom surface 20*a*, and the bottom covering portion 11*b*. The bottom covering portion 11*b* and the top covering portion 11*d* are connected to each other. Specifically, the bottom covering portion 11*b* and the top covering portion 11*d* are connected to each other by means of a portion located on the right-hand side of the external connection portion 22 and by means of a portion located on the left-hand side of the external connection portion 22. In the above-described configuration, both the portion located on the right-hand side of the base portion 22*a* of the external connection portion 22 of the busbar 20B and the portion located on the left-hand side of the base portion 22*a* of the external connection portion 22 of the busbar 20B are parts of the peripheral portion 11R of the holding member 11, and are the portions, together with the covering portions 11*b* and 11*d*, surrounding the base portion 22*a* of the external connection portion 22.

The outer edges of the part-mounting portion 21 in each of the busbars 20A and 20B are connected to the holding member 11 all around the part-mounting portion 21. To be more specific, a right-hand-side edge 21*f*, a left-hand-side edge 21*g*, a front edge 21*h*, and a rear edge 21*i* of the part-mounting portion 21 of the busbar 20A are connected to the holding member 11. In addition, a right-hand-side edge 21*j*, a left-hand-side edge 21*k*, a front edge 21*m*, and a rear edge 21*n* of the part-mounting portion 21 of the busbar 20B are also connected to the holding member 11. Hence, the base portion 22*a* of the external connection portion 22 of each of the busbars 20A and 20B and the edges of the part-mounting portion 21 are surrounded by the holding member 11. With this structure, the holding member 11 may hold the busbars 20A and 20B with an increased holding strength.

The external connection portion 22 of each of the busbars 20A and 20B extends in a horizontal direction (either forwards or rearwards) through the interstice between the corresponding one of the bottom covering portions 11*a* and 11*b* and the corresponding one of the top covering portions 11*c* and 11*d*. Most of the external connection portions are located outside of the outer edges of the holding member 11 (see FIG. 1). Specifically, the external connection portion 22 of the busbar 20A extends forwards through a holding hole H1 (see FIG. 5) formed in a side surface 11*f* of the holding member 11. Likewise, the external connection portion 22 of the busbar 20B extends rearwards through a holding hole (not illustrated) formed in a different side surface of the holding member 11, which is located on the opposite side to the side surface 11*f*.

It should be noted that the structure for allowing the holding member 11 to hold the busbars 20A and 20B is not limited to the example described here. For instance, edges of the part-mounting portions 21 of the busbars 20A and 20B may be formed to catch the holding member 11. For instance, edges of part-mounting portions 21 of the busbars 20A and 20B may be partially chamfered. In this case, the holding member 11 may be caught by the slopes formed by the chamfering, and thus the holding strength of the holding member 11 may be improved. In addition, end surfaces of the busbars 20A and 20B (the surfaces defining the thicknesses of the busbars 20A and 20B) may be roughened. Also, in this case, the holding member 11 is caught by the roughened surfaces, and thus the holding strength of the holding member 11 may be improved.

As illustrated in FIG. 2 and FIG. 3, the circuit assembly 10 includes the region E where the electronic components 30A and 30B are disposed. The part-connecting regions Ra3 and Rb3 described earlier of the busbars 20A and 20B are included in this region E. The holding member 11 includes a peripheral portion 11R surrounding the region E. The thickness T1 (see FIG. 7) of the peripheral portion 11R is thicker than the thickness T2 (see FIG. 7) of the circuit assembly 10 in the region E. To put it differently, the thickness T1 is thicker than the thickness T2 of the holding member 11 and the corresponding one of the busbars 20A and 20B in the region E. The presence of the peripheral portion 11R reinforces the stiffness of the holding member 11. In the illustrated example of the circuit assembly 10, the peripheral portion 11R surrounds the entire contours of the region E. The peripheral portion 11R with a large thickness T1 may be provided in only a portion of the entire contours of the region E.

The electronic components 30A and 30B are disposed in a close proximity to the top surfaces 20*b* in the part-connecting regions Rb3. In the illustrated example of the circuit assembly 10, as illustrated in FIG. 8, bottom surfaces 34*a* of the main bodies 34 of the electronic components 30A and 30B are at a lower level than a top surface 11*e* of the peripheral portion 11R. The locations of the electronic components 30A and 30B are not limited to those of the illustrated example of circuit assembly 10.

It should be noted that the power terminals 31 of the electronic components 30A and 30B are soldered to the part-connecting regions Ra3 and that the power terminals 33 are soldered to the part-connecting regions Rb3. The height of the top surface 11*e* of the peripheral portion 11R of the holding member 11 is higher than the height of the part-connecting regions Ra3 and Rb3. Hence, in a process of soldering the electronic components 30A and 30B, solder may be put in the part-connecting regions Ra3 and Rb3 by means of, for example, a dispenser instead of using a mask or printing.

As described earlier, each of the busbars 20A and 20B includes a plurality of portions exposed from the holding member 11. Specifically, such portions are the external connection portion 22, the part-connecting regions Ra3 and Rb3, as well as the exposed regions Ra1 and Rb1.

The external connection portion 22 of each of the busbars 20A and 20B is exposed from the side surface 11*f* of the holding member 11, has a flat-plate shape sticking out in the planer direction (specifically, in the front-rear direction) of the holding member 11, and is in electrical connection with external parts and devices, such as other circuits.

Figure 7:
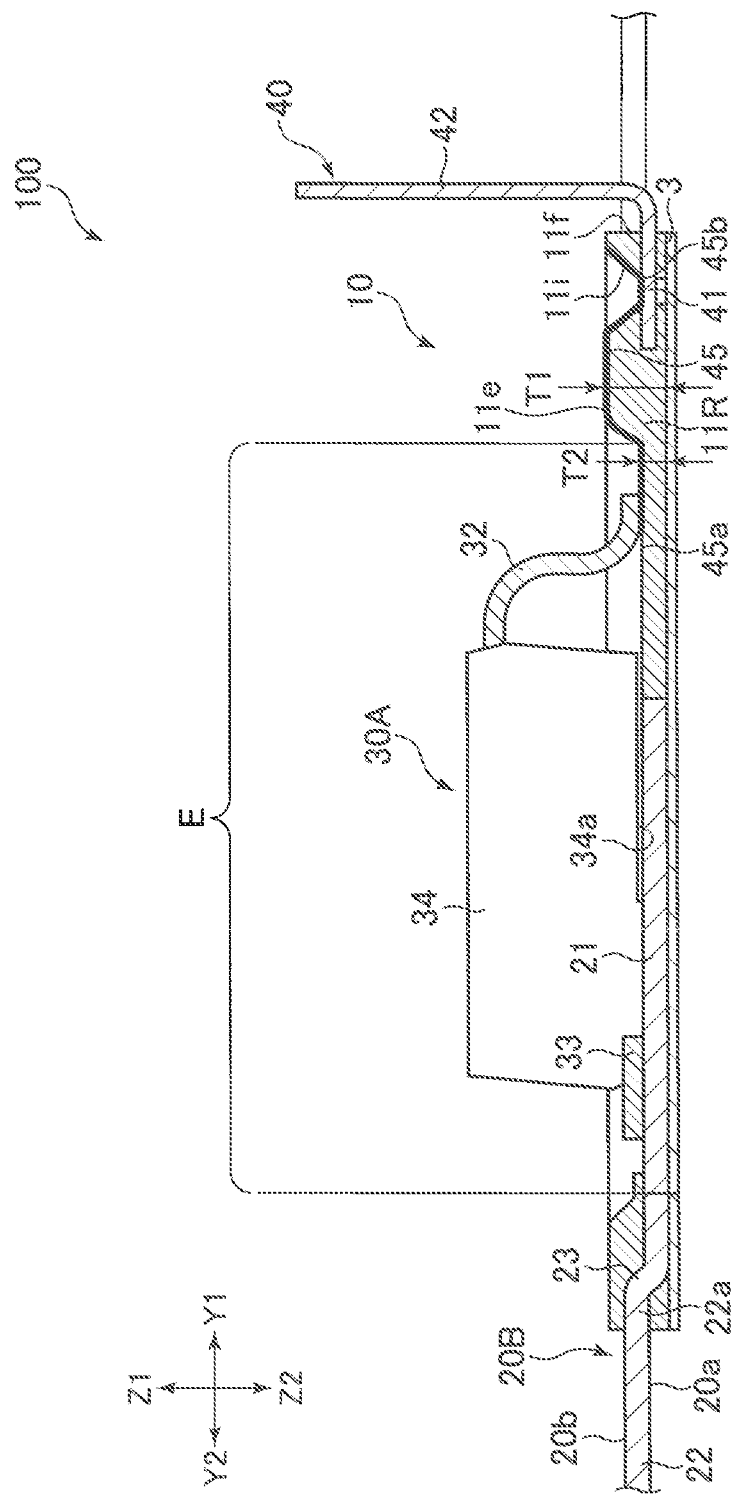
FIG. 7 is a cross-sectional view of a portion taken along the line VII-VII of FIG. 6.

Of the two busbars 20A and 20B, a first one, i.e., the busbar 20A, has its part-connecting region Ra3 not covered with the holding member 11. The part-connecting region Ra3 is exposed from the top surface (i.e., the surface on which the electronic components 30A and 30B are mounted) of the circuit assembly 10 and is in electrical connection with the power terminal 31 of the electronic component 30A. The busbar 20B, i.e., the second one of the two, has its part-connecting region Rb3 not covered with the holding member 11. The part-connecting region Rb3 is exposed from the top surface (i.e., the surface on which the electronic components 30A and 30B are mounted) of the circuit assembly 10 and is in electrical connection with the power terminals 33 of the electronic components 30A and 30B. In addition, the part-connecting region Rb3 is in thermal connection with the main bodies 34 of the electronic components 30A and 30B. The exposed regions Ra1 and Rb1 of their respective busbars 20A and 20B are not covered with the holding member 11 and are exposed from the bottom surface of the circuit assembly 10 (i.e., the opposite surface to the top surface). In an example of the circuit assembly 10, the exposed regions Ra1 and Rb1 are in thermal connection with the heat-dissipation sheet 3, which is pasted on the almost entire bottom surface of the circuit assembly 10. It should be noted that the bottom surfaces 20*a* in the exposed regions Ra1 and Rb1 and the bottom surface of the holding member 11 are preferably located in substantially the same plane in a side elevation view of the holding member 11 (when viewed in the arrow V1 direction in FIG. 6). With such a configuration, the heat-dissipation sheet 3 may be pasted on the bottom surface of the circuit assembly 10 without any gap left between the heat-dissipation sheet 3 and the bottom surface 20*a* of each of the busbars 20A and 20B as illustrated in FIG. 7 and FIG. 8.

In addition, it is also preferable that at least some parts of the exposed regions Ra1 and Rb1 of their respective busbars 20A and 20B should be in the backside surface of the part-connecting regions Ra3 and Rb3. To put it differently, the part-connecting regions Ra3 and Rb3 of the top surfaces 20*b* of the busbars 20A and 20B are where electronic components are connected. It is preferable that at least some portions of the exposed regions Ra1 and Rb1 should be defined in the backside surface of the part-connecting regions Ra3 and Rb3. With such a configuration, the heat generated from the electronic components 30A and 30B may be transferred efficiently to the exposed regions Ra1 and Rb1.

A type of the electronic components 30A and 30B may include the signal terminal 32 in addition to the power terminals 31 and 33. Hence, in the illustrated example, the circuit assembly 10 further includes a signal circuit C1 (see FIG. 1) in addition to the busbars 20A and 20B.

The signal circuit C1 includes: a signal terminal 40 configured to be in electrical connection with external parts and devices; and a connection circuit (electric conductor pattern) 45 configured to be in electrical connection with the signal terminals 32 of the electronic components 30A and 30B.

The signal terminal 40 is, for example, a member formed of a metal plate by a punching process. Like the busbars 20A and 20B, a portion of the signal terminal 40 is exposed, and in that state, the signal terminal 40 is held by the holding member 11 made integrally from an insulating material. Specifically, in a state where the busbars 20A and 20B as well as the signal terminal 40 are disposed in a cavity formed by the molds, the cavity is filled up with a soft resin material that will be the holding member 11. Once the resin becomes hardened, the busbars 20A and 20B as well as the signal terminal 40 are held by the resin (holding member 11). Hence, a portion of the signal terminal 40 is buried in and thus fixed to the holding member 11.

As illustrated in FIG. 7, the signal terminal 40 has a portion 41 held by the holding member 11 (portion 41 buried in the holding member 11). Hereinafter, this portion 41 will be referred to as the "held portion." In addition, the signal terminal 40 includes an external connection portion 42 extending from the held portion 41 and located outside of the holding member 11. In the illustrated example of the circuit assembly 10, the held portion 41 extends in a horizontal direction (in a direction along the circuit assembly 10). The external connection portion 42, on the other hand, sticks out from the side surface 11*f* of the holding member 11 and extends upwards. Hence, the signal terminal 40 is substantially L-shaped. When the mounting unit 100 is in use, the circuit assembly 10 is united with a different device disposed above the circuit assembly 10. In that state, the external connection portion 42 of the signal terminal 40 is in electrical connection with the corresponding terminal of the different device.

The signal terminal 40 is located on an edge of the circuit assembly 10. In the illustrated example of the circuit assembly 10, the signal terminal 40 sticks out from the side surface 11*f* of the holding member 11, as described earlier. The location of the signal terminal 40 helps reduce the overlapping of the signal terminal 40 with the busbars 20A and 20B in plan view. This makes it easier to insert-mold the signal terminal 40 as well as the busbars 20A and 20B.

The shape and the location of the signal terminal 40 are not limited to the examples described above. For instance, two or more signal terminals 40 may be provided in the circuit assembly 10. In this case, it is preferable that the plurality of signal terminals 40 should be disposed in a close proximity to each other. This may make easier the work for uniting the circuit assembly 10 with the device disposed above the circuit assembly 10. In this case, the plurality of signal terminals 40 may preferably be aligned with each other along an edge of the circuit assembly 10. In a different example, the signal terminal 40 may stick out upwards from the top surface 11*e* of the holding member 11.

A connection circuit 45 is formed, for instance, by the following method. Electrically-conductive ink (e.g., silver ink) is disposed on the top surface 11*e* of the holding member 11 by a printing method or by a dispensing method. In doing so, the ink is connected to a metal plate exposed from the holding member 11 (the signal terminal 40 exposed in a hole 11*i* (to be described later)). Then, the portions with ink will be formed into thicker films by a copper electroplating method. The thick-film portions become the connection circuit 45. The method of forming the connection circuit 45 is not limited to the one described above. For instance, an electrically conductive paste may be disposed on the top surface 11*e* of the holding member 11 by printing or by using a mask, and the paste thus disposed may be used as the connection circuit 45.

Figure 1:
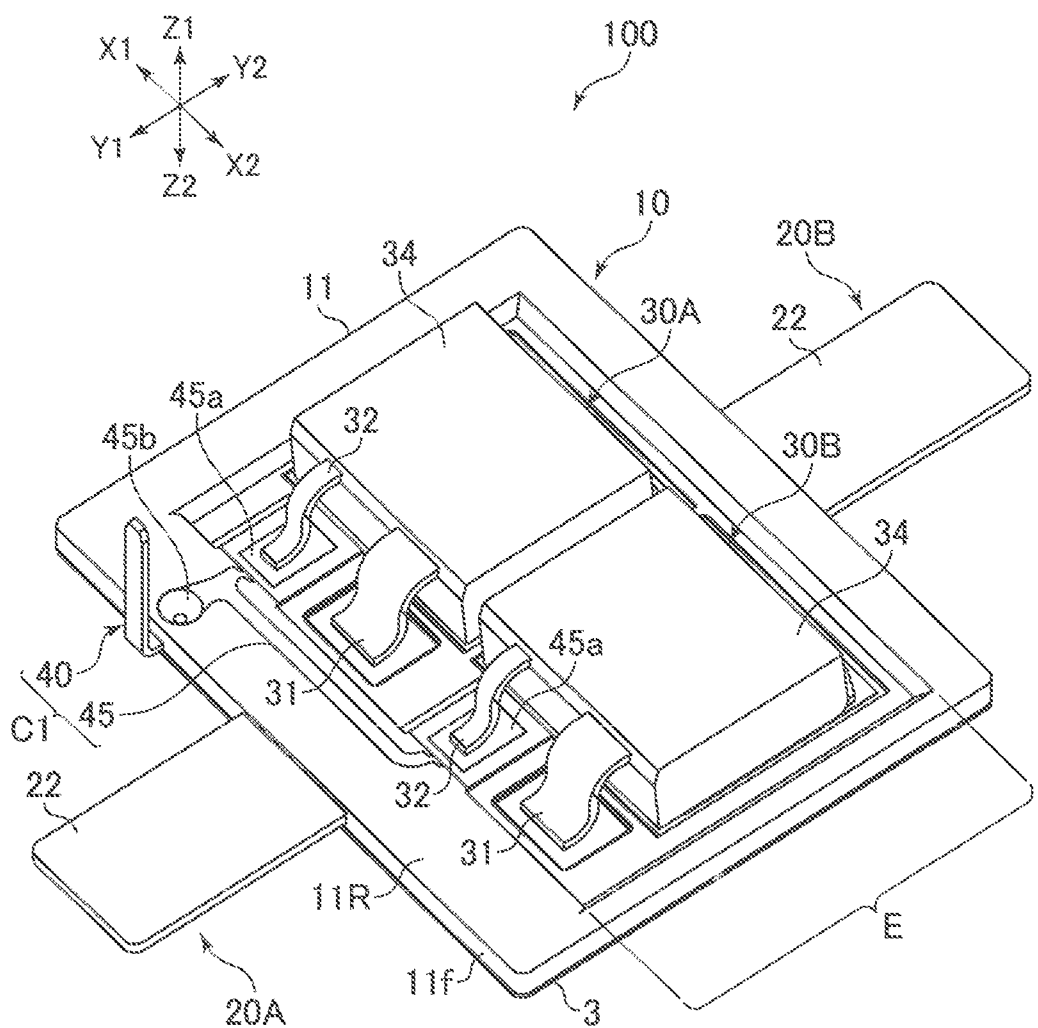
FIG. 1 is a perspective view of a top surface of a mounting unit viewed from an upper left position.

In the illustrated example of the circuit assembly 10, a portion 45*a* of the connection circuit 45 is within the above-described region E as illustrated in FIG. 1 and FIG. 7. The portion 45*a* will be referred to as the "first connection portion." The position of the first connection portion 45*a* corresponds to the position of the signal terminal 32 of the above-described electronic components 30A and 30B. The signal terminal 32 is soldered to the first connection portion 45*a*. A different portion 45*b* of the connection circuit 45 passes through the hole 11*i* (hereinafter, referred to as "connection hole") formed in the holding member 11, and is connected to the signal terminal 40. Hereinafter, the portion 45*b* will be referred to as the "second connection portion." To be more specific, the top surface 11*e* of the peripheral portion 11R of the holding member 11 has a connection hole 11*i* formed at a position corresponding to the held portion 41 of the signal terminal 40. The connection hole 11*i* is formed down to the held portion 41, and the held portion 41 is exposed in the connection hole 11*i*. The second connection portion 45*b* is formed in the connection hole 11*i* and is connected to the held portion 41. As described above, the signal terminals 32 of the electronic components 30A and 30B are connected to the signal terminal 40 via the connection circuit 45.

In the illustrated example of the circuit assembly 10, the connection hole 11*i* is a circular hole as illustrated in FIG. 1 and FIG. 5. The shape of the connection hole 11*i* is not limited to the circular one. Any shape may be employed as long as it allows the held portion 41 of the signal terminal 40 to be exposed partially. The shape of the connection hole 11*i* may be changed appropriately by taking account of such factors as: the stability of the electric connection between the signal terminal 40 and the electrically conductive ink used for the connection circuit 45; and the locations of other components. For instance, the connection hole 11*i* may have a quadrilateral shape in plan view. Alternatively, a recessed portion having an opening that opens two mutually orthogonal directions (e.g., upwards and forwards) (see FIG. 11A) may be formed instead of the connection hole 11*i* with an opening that opens only a single direction (specifically, upwards). The structure illustrated in FIG. 11A will be described later.

As described earlier, the holding member 11 includes the top covering portion 11*c* configured to cover the top surface 20*b* of the busbar 20A. In the illustrated example of the circuit assembly 10, the connection circuit (electric conductor pattern) 45 is also formed on the top surface 11*e* of the top covering portion 11*c*, as illustrated in FIG. 8. Hence, in the plan view of the circuit assembly 10, the busbar 20A and the connection circuit 45 intersect each other. With this structure, the layout of the connection circuit 45 is not affected by the position and the shape of the busbar 20A. Hence, the connection circuit 45 may enjoy a higher degree of layout freedom. As a result, the signal terminal 40 may enjoy a higher degree of positional freedom. The positional relations of the connection circuit 45 with the busbars 20A and 20B are not limited to the ones of the illustrated example of the circuit assembly 10.

It should be noted that the structure for connecting the terminals 32 of the electronic components 30A and 30B with the signal terminal 40 is not limited to the illustrated example of the circuit assembly 10. For instance, the signal terminals 32 of the electronic components 30A and 30B may be connected to the signal terminal 40 by means of the wiring attached by a wire-bonding method, a welding method, or the like. In another allowable example of the connection structure, an end of the signal terminal 40 may be directly and electrically connected to the signal terminals 32 of the electronic components 30A and 30B without using the connection circuit 45.

It should be noted that, as illustrated in FIG. 1 to FIG. 8, the circuit assembly 10 in an embodiment of the disclosure is described by assuming that the circuit assembly 10 includes two busbars 20A and 20B and a single signal circuit C1. It is, however, allowable to change appropriately the number of the busbars 20A and 20B and/or the number of the signal circuits C1 depending upon the kinds and the number of the electronic components 30A and 30B and/or upon other factors.

Next, a description will be provided of the mounting unit 100 where the electronic components 30A and 30B are mounted on the circuit assembly 10.

As illustrated in FIG. 1 and FIG. 2, the mounting unit 100 includes the circuit assembly 10, the electronic components 30A and 30B, and the heat-dissipation sheet 3. Each of the electronic components 30A and 30B is disposed to cover the corresponding set of the part-connecting regions Ra3 and Rb3 of their respective ones of the two busbars 20A and 20B of the circuit assembly 10. The power terminals 31 and 33 are electrically connected, by soldering or the like method, to the part-connecting regions Ra3 and Rb3 of the busbars 20A and 20B, respectively. In the meanwhile, the main bodies 34 of the electronic components 30A and 30B are thermally connected to the part-connecting regions Rb3 of the busbar 20B. The bottom surfaces 34*a* of the main bodies 34 of the electronic components 30A and 30B may be in contact with the part-connecting regions Rb3. Alternatively, there may be a gap between each of the bottom surfaces 34*a* and the corresponding part-connecting region Rb3.

As described earlier, while the part-connecting region Rb3 is where the power terminal 33 is attached, the part-connecting region Rb3 is located on the opposite side to the side where the exposed region Rb1 is located. Hence, the electronic components 30A and 30B are located on the opposite side of the busbar 20B to the side where the exposed region Rb1 is located. Hence, in plan view, at least some portions of the main bodies 34 of the electronic components 30A and 30B overlap the exposed region Rb1. As a result, a shorter heat transferring path is provided from the electronic components 30A and 30B to the exposed region Rb1, and thus more efficient heat dissipation may be achieved.

It should be noted that in the mounting unit 100 of the example illustrated in FIG. 1, the two electronic components 30A and 30B are disposed between the part-connecting regions Ra3 and Rb3 of the two busbars 20A and 20B. The number of electronic components to be disposed between the part-mounting portion 21 of the two busbars 20A and 20B may be one or may be more than two.

The heat-dissipation sheet 3 is made of an insulating material with a high thermal conductivity such as silicone rubber and is pasted on the exposed regions Ra1 and Rb1 of the circuit assembly 10 by heat sealing, adhesives, or the like methods. As illustrated in FIG. 2, FIG. 7, and FIG. 8, the exposed regions Ra1 and Rb1 exposed from the bottom surface of the circuit assembly 10 are thermally connected to electronic components 30 via a part-connecting region R3 and are exposed as a broad area in the bottom surface of the circuit assembly 10 to achieve efficient heat dissipation. Hence, the single heat-dissipation sheet 3 is pasted on the almost entire portion of that surface of the circuit assembly 10.

With such a configuration, the heat-dissipation sheet 3 may allow the heat generated from an electronic component 30*r* to be radiated more efficiently. In addition, even though the exposed regions Ra1 and Rb1 of the bottom surface 20*a* of the busbars 20A and 20B are exposed, the heat-dissipation sheet 3 made of an insulating material prevents a short circuit from taking place between any other component and the busbars 20A and 20B. Hence, the mounting unit 100 may be mounted on an external part/device easily. It should be noted that in an embodiment of the disclosure, the heat-dissipation sheet 3 is pasted as described earlier, but that within the bottom surface of the circuit assembly 10, the area dedicated to the dissipation of heat generated from the electronic components 30A and 30B may be selected appropriately and the heat-dissipation sheet 3 may be pasted only on the area.

Next, a description is provided of the state of using the mounting unit 100. When, in the mounting unit 100, electric power is supplied to the external connection portion 22 of the first busbar 20A formed integrally with the holding member 11, the electric power flows through the part-mounting portion 21 of the first busbar 20A, the first power terminals 31 of the electronic components 30A and 30B, the main bodies 34 of the electronic components 30A and 30B, the second power terminals 33 of the electronic components 30A and 30B, the part-mounting portion 21 of the second busbar 20B, and the external connection portion 22 of the second one of the busbars 20A and 20B.

In the meanwhile, the supply of electric power causes the electronic components 30A and 30B to generate heat. The heat thus generated is transferred from the main bodies 34 of the electronic components 30A and 30B, to the part-connecting region Rb3 of the second busbar 20B, then to the exposed region Rb1 of the second busbar 20B, and then to the heat-dissipation sheet 3. In addition, heat is also generated: by the electric resistance of the connection portion of the part-mounting portions 21 of the busbars 20A and 20B with the power terminals 31 and 33 of the electronic components 30A and 30B; and by the electric resistance of the connection portion of the external connection portions 22 of the busbars 20A and 20B with the external parts/devices. Such heat may also be transferred efficiently to the heat-dissipation sheet 3 as is the case with the above-mentioned heat.

In this way, the heat generated from the electronic components 30A and 30B is transferred, via only the busbars 20A and 20B and thus against a low thermal resistance, in the plane direction of the heat-dissipation sheet 3, in the direction perpendicular to the heat-dissipation sheet 3, and in directions intersecting these directions. Hence, efficient heat dissipation may be achieved while a reduction may be achieved in the heat transfer to the signal terminals 32 of the electronic components 30A and 30B, the signal terminal 40 of the circuit assembly 10, external parts/devices connected to the circuit assembly 10, and other components/devices disposed around the mounting unit 100.

As described thus far, the plurality of busbars 20A and 20B are formed integrally with the holding member 11 in the circuit assembly 10. Hence, the positioning of the busbars 20A and 20B may be easy and the circuit assembly 10 may be manufactured at low cost. In addition, some portions of the busbars 20A and 20B may be exposed easily from the top surface 11*e* and the bottom surface of the holding member 11. Moreover, the shapes of the exposed areas thus formed may be changed easily.

In general, if two electrically conductive members are connected to each other by means of solder or the like, the connection portion may have an electric resistance that is high enough to generate heat. The busbars 20A and 20B in the embodiment of the disclosure, however, are integrally formed, without any connection portion using solder or the like, from the part-connecting regions Ra3 and Rb3 to the external connection portions 22. In addition, in the busbars 20A and 20B, the part-connecting regions Ra3 and Rb3 configured to be connected to the electronic components 30A and 30B have their bottom surfaces including exposed regions Ra1 and Rb1, respectively. Hence, heat may be dissipated from the busbars 20A and 20B efficiently. Accordingly, though the main bodies 34 of the electronic components 30A and 30B, as well as the connection portions of the electronic components 30A and 30B with their corresponding busbars 20A and 20B may have electric resistances, such electric resistances are prevented from generating heat that would otherwise heat the mounting unit 100 up to a high temperature. In addition, the plurality of the busbars 20A and 20B are formed integrally with the holding member 11 in the circuit assembly 10. Hence, the bottom surface of the holding member 11 and the bottom surfaces of the busbar 20A and 20B may be easily positioned within a single plane. In addition, the exposed regions of the busbars 20A and 20B may be easily broadened. Moreover, the heat-dissipation sheet may be pasted on the bottom surface of the circuit assembly 10 easily with no gap left between the bottom surface and the sheet. Accordingly, the heat generated from the electronic components may be dissipated easily.

Furthermore, the heat generated from the electronic components 30A and 30B may be transferred to the heat-dissipation sheet 3 via the busbars 20A and 20B. Hence, the heating of the mounting unit 100 may be reduced.

Figure 9:
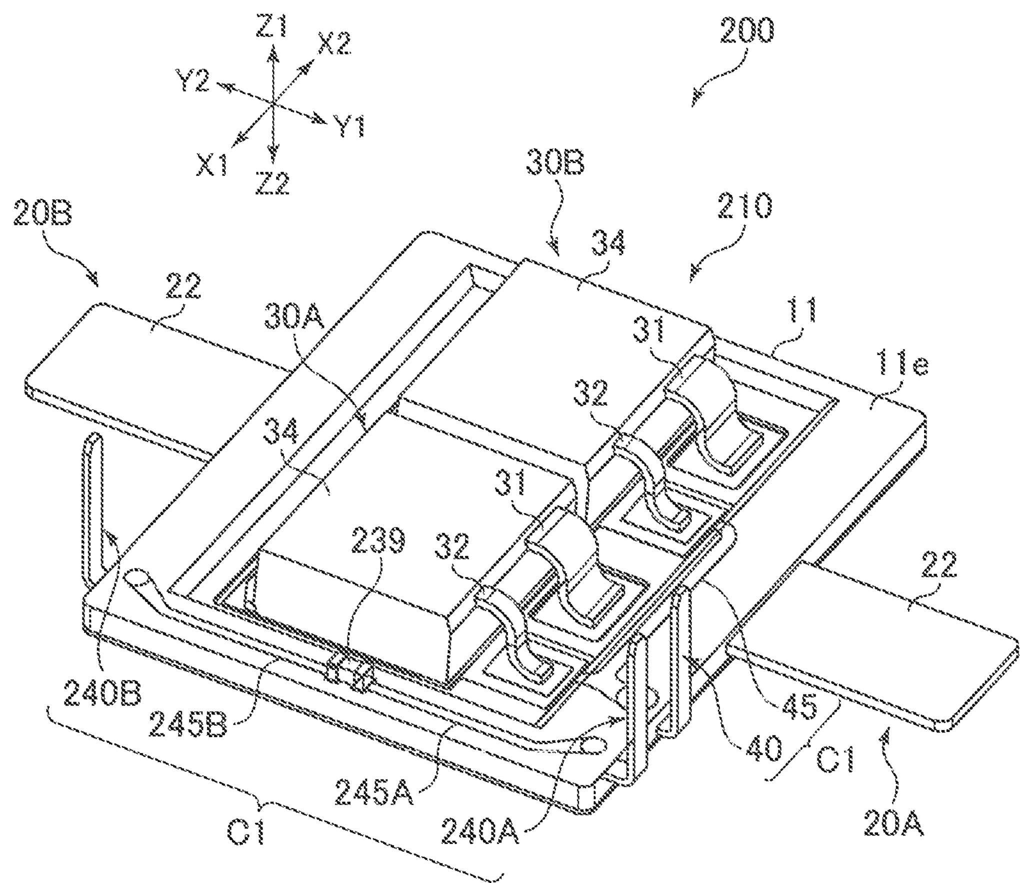
FIG. 9 is a perspective view illustrating a different exemplar circuit assembly and a different exemplar mounting unit.
Figure 10:
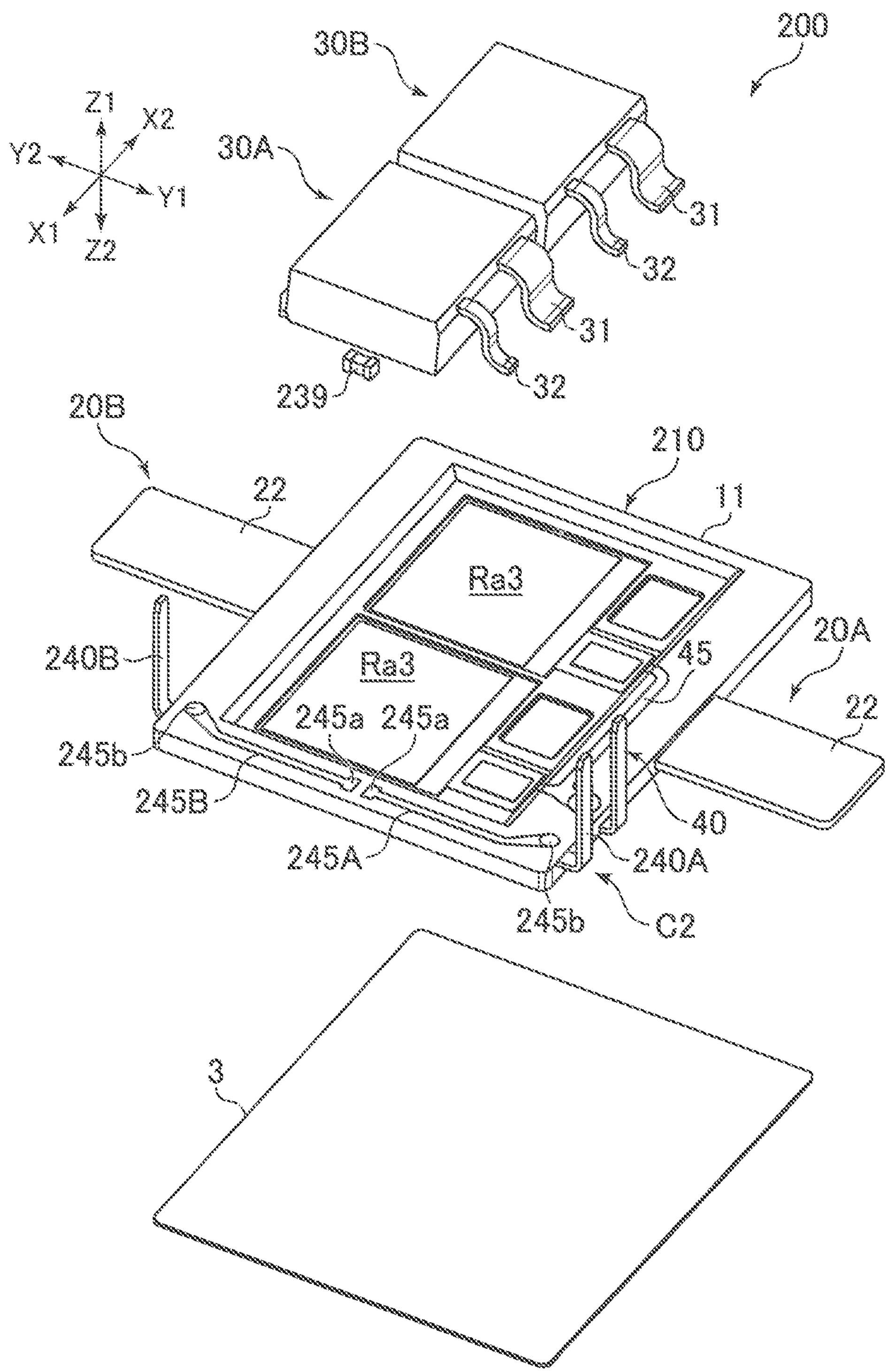
FIG. 10 is an exploded perspective view illustrating the different exemplar circuit assembly and the different exemplar mounting unit.

FIG. 9 and FIG. 10 illustrate a circuit assembly 210 and a mounting unit 200 as other examples of the circuit assembly and the mounting unit proposed by the disclosure. In these drawings, like reference numerals are given to like members/portions that have already been described thus far. The following description will focus the differences between the circuit assembly 210 and the circuit assembly 10. The points that are not described in relation to the circuit assembly 210 and the mounting unit 200 should be understood in the same manner as the corresponding points in the examples of the circuit assembly 10 and the mounting unit 100.

As illustrated in FIG. 9, the circuit assembly 210 includes not only the above-described signal circuit C1 but also a signal circuit C2. The signal circuit C2 includes two signal terminals 240A and 240B and two connection circuits (electric conductor patterns) 245A and 245B. The connection circuits 245A and 245B are formed on the top surface 11*e* of the peripheral portion 11R of the holding member 11. The connection circuits 245A and 245B may be formed, for instance, in the same manner as that employed for the formation of the connection circuit 45. For instance, electrically-conductive ink (e.g., silver ink) is disposed on the top surface 11*e* of the holding member 11 by a printing method or by a dispensing method. Then, the portions with ink will be formed into thicker films by a copper electroplating method. The thick-film portions become the connection circuits 245A and 245B.

As illustrated in FIG. 10, the connection circuits 245A and 245B have end portions where connection portions 245*a* are provided. The connection portions 245*a* are formed also on the top surface 11*e* of the peripheral portion 11R. The mounting unit 200 includes an electronic component 239. The electronic component 239 has two terminals each of which is attached to the corresponding one of the connection portions 245*a*.

Like the signal terminal 40 described earlier, the signal terminals 240A and 240B are insert-molded together with the holding member 11. Like the signal terminal 40 described earlier, each of the signal terminals 240A and 240B has the held portion 41 (see FIG. 7) configured to be held by the holding member 11. The holding member 11 has the connection holes 11*i* at positions corresponding to the held portions 41. The connection circuits 245A and 245B are connected to the held portions 41 of the signal terminals 240A and 240B, respectively at connection portions 245*b* formed in the connection holes 11*i*. Hence, the signal terminal 240A and 240B are electrically communicated to electronic component 239.

It should be noted that the shapes, the positions, and the number of the connection circuit 245A and 245B are not limited to those of the illustrated example, but may be changed appropriately. The position(s) and the number of the electronic component(s) 239 may be changed appropriately.

Figure 11A:
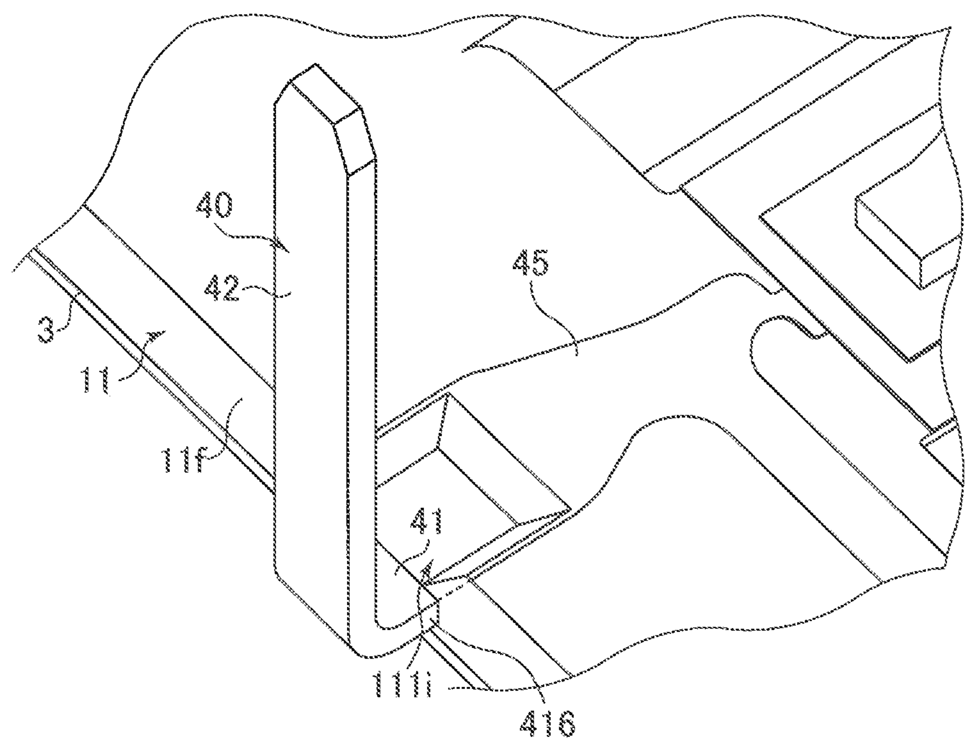
FIG. 11A is a perspective view illustrating a modified example of a connection structure between a signal terminal and a connection circuit (electric conductor pattern).
Figure 11B:
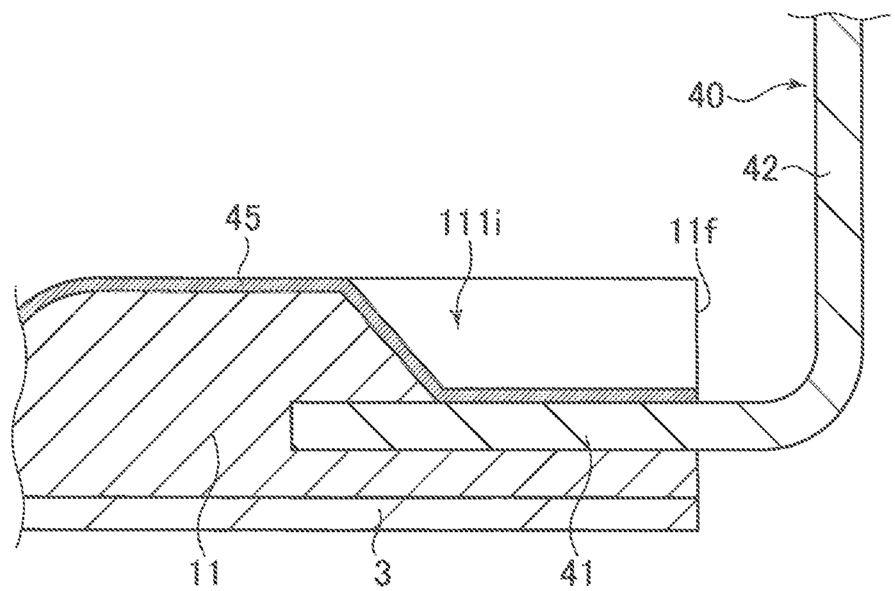
FIG. 11B is a cross-sectional view of the structure illustrated in FIG. 11A.

FIG. 11A and FIG. 11B illustrate a modified example of the connection structure between the signal terminal 40 and the connection circuit 45. FIG. 11A is a perspective view, and FIG. 11B is a cross-sectional view. In the example illustrated in these drawings, a connection recessed portion 111*i* is formed in the holding member 11. The connection recessed portion 111*i* differs from the connection hole 11*i* described earlier in that the connection recessed portion 111*i* reaches the side surface 11*f* of the holding member 11 and that the connection recessed portion 111*i* has an opening that opens two mutually orthogonal directions (specifically, upward and forward of the holding member 11). The held portion 41 of the signal terminal 40 is partially exposed in the connection recessed portion 11*i*. The connection circuits 45 are formed of electrically conductive ink on the held portion 41 and on the internal surface of the connection recessed portion 111*i*. As illustrated in FIG. 11B, an end portion 41*a* of the held portion 41 is held by the holding member 11 (i.e., the portion 41 is buried in the resin of the holding member 11). In the example illustrated in FIG. 11A, a right-hand-side edge 41*b* and a left-hand-side edge of the held portion 41 are also held by the held portion 11 (i.e., they are buried in the resin of the holding member 11). With this structure, the holding member 11 may ensure a certain holding strength to hold the signal terminal 40.

Note that the present disclosure describes only an example, and thus any appropriate change that preserves the gist of the present disclosure and can easily be conceived by a person skilled in the art is within the scope of the present disclosure. The widths, thicknesses, and shapes of the portions illustrated in the drawings are illustrated schematically and are not intended to limit the interpretation of the present disclosure.

The invention claimed is:

1. A circuit assembly comprising:

a holding member made of resin; and a busbar including a first surface facing a first direction and a second surface facing an opposite direction to the first direction, and formed integrally with the holding member, wherein the first surface includes an exposed region that is exposed from the holding member in the first direction, the first surface includes a first covered region covered by the holding member, the holding member includes a first covering portion configured to cover the first covered region, and the first surface in the exposed region is located at a position further advanced in the first direction than the first surface in the first covered region.

2. A mounting unit comprising:

the circuit assembly according to claim 1; and an electronic component mounted on the second surface of the busbar.

3. A circuit assembly comprising:

a holding member made of resin; and a busbar including a first surface facing a first direction and a second surface facing an opposite direction to the first direction, and formed integrally with the holding member, wherein the first surface includes an exposed region that is exposed from the holding member in the first direction, the second surface includes a part-connecting region exposed from the holding member and a second covered region configured to be covered by the holding member, the holding member includes a second covering portion configured to cover the second covered region, and the second surface in the part-connecting region is located at a position that is further advanced in the first direction than a surface of the second covering portion.

4. The circuit assembly according to claim 3, wherein the first surface includes a first covered region covered by the holding member, the holding member includes a first covering portion configured to cover the first covered region, and the first surface in the exposed region is at a height which is the same as a surface of the first covering portion or is located at a position further advanced in the first direction than the surface of the first covering portion.

5. The circuit assembly according to claim 4, wherein the first surface of the busbar, the second surface of the busbar, the first covering portion of the holding member, and the second covering portion of the holding member are arranged in the first direction in an order of the second covering portion, the second surface, the first surface, and the first covering portion.

6. A mounting unit comprising:

the circuit assembly according to claim 3; and an electronic component mounted on the second surface of the busbar.

7. A circuit assembly comprising:

a holding member made of resin; and a busbar including a first surface facing a first direction and a second surface facing an opposite direction to the first direction, and formed integrally with the holding member, wherein the first surface includes an exposed region that is exposed from the holding member in the first direction, the second surface includes a part-connecting region exposed from the holding member and configured to connect the electronic component, and at least a portion of the part-connecting region is located on an opposite side to a side where the exposed region is located.

8. A mounting unit comprising:

the circuit assembly according to claim 7; and an electronic component mounted on the second surface of the busbar.

9. A circuit assembly comprising:

a holding member made of resin;

a busbar including a first surface facing a first direction and a second surface facing an opposite direction to the first direction, and formed integrally with the holding member;

an electric conductor pattern formed on a surface of the holding member; and a terminal held by the holding member, wherein the first surface includes an exposed region that is exposed from the holding member in the first direction, the holding member includes a portion configured to cover the terminal, and a hole or a recessed portion formed in the portion configured to cover the terminal and allowing the terminal to be partially exposed; and the electric conductor pattern is connected to the terminal through the hole or the recessed portion.

10. A mounting unit comprising:

the circuit assembly according to claim 9; and an electronic component mounted on the second surface of the busbar.

* * * * *